(12) United States Patent
Arai et al.

(10) Patent No.: US 6,303,239 B1
(45) Date of Patent: *Oct. 16, 2001

(54) ORGANIC ELECTROLUMINESCENT DEVICE

(75) Inventors: Michio Arai; Isamu Kobori; Etsuo Mitsuhashi, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/241,284

(22) Filed: Feb. 1, 1999

(30) Foreign Application Priority Data

Oct. 9, 1998 (JP) .................................................. 10-303350

(51) Int. Cl.$^7$ ............................. H01L 33/00; H05B 33/00
(52) U.S. Cl. ........................... 428/690; 257/96; 257/103; 313/502; 313/503; 313/509
(58) Field of Search .................................... 428/690, 917; 257/96, 103; 313/502, 503, 509

(56) References Cited

U.S. PATENT DOCUMENTS

| 5,776,623 | 7/1998 | Hung et al. |
|---|---|---|
| 5,853,905 | 12/1998 | So et al. |
| 5,869,929 * | 2/1999 | Eida et al. ........................... 313/501 |
| 5,952,779 | 9/1999 | Arai et al. ........................... 313/504 |
| 5,969,474 | 10/1999 | Arai ..................................... 313/504 |
| 6,111,274 * | 8/2000 | Arai ..................................... 257/96 |
| 6,198,219 * | 3/2001 | Arai et al. ........................... 313/504 |

FOREIGN PATENT DOCUMENTS

| 0 740 489 | 10/1996 | (EP) . |
|---|---|---|
| 5-3080 | 1/1993 | (JP) . |
| 9-17574 | 1/1997 | (JP) . |
| 10-125474 | 5/1998 | (JP) . |
| WO 98/10473 | 3/1998 | (WO) . |
| WO 00/05928 | 2/2000 | (WO) . |

* cited by examiner

Primary Examiner—Bruce H. Hess
Assistant Examiner—Dawn L. Garrett
(74) Attorney, Agent, or Firm—Oblon, Spivak, McClelland, Maier & Neustadt, P.C.

(57) ABSTRACT

An object of the invention is to achieve an organic EL device which has an extended life, weather resistance, high stability, and high efficiency, and is inexpensive as well. This object is accomplished by the provision of an organic EL device comprising a substrate, a pair of a hole injecting electrode and a cathode formed on the substrate, and an organic layer located between these electrodes and taking part in at least a light emission function, wherein between the organic layer and the cathode there is provided an inorganic insulating electron injecting and transporting layer comprising a first component comprising at least one oxide selected from the group consisting of lithium oxide, rubidium oxide, potassium oxide, sodium oxide and cesium oxide, a second component comprising at least one oxide selected from the group consisting of strontium oxide, magnesium oxide and calcium oxide, and a third component comprising silicon oxide and/or germanium oxide.

4 Claims, 2 Drawing Sheets

ORGANIC ELECTROLUMINESCENT DEVICE

BACKGROUND OF THE INVENTION

1. Technical Art

The present invention relates generally to an organic EL (electroluminescent) device, and more specifically to an inorganic/organic junction structure used for a device comprising an organic compound thin film which emits light at an applied electric field.

2. Background Art

In general, an organic EL device is basically built up of an ITO or other transparent electrode formed on a glass substrate, an organic amine base hole transporting layer laminated on the transparent electrode, an organic light emitting layer formed of a material having electronic conductivity and giving out strong light emission, for instance, an $Alq^3$ material, and an electrode provided on the organic light emitting layer and formed of a material having a low work function, for instance, an MgAg material.

As reported so far in the art, the device has a structure wherein one or plural organic compound layers are interleaved between a hole injecting electrode and an electron injecting electrode. The organic compound layer has a double- or triple-layer structure.

Examples of the double-layer structure are a structure wherein a hole transporting layer and a light emitting layer are formed between the hole injecting electrode and the electron injecting electrode, and a structure wherein a light emitting layer and an electron transporting layer are formed between the hole injecting electrode and the electron injecting electrode. In an exemplary triple-layer structure, a hole transporting layer, a light emitting layer and an electron transporting layer are provided between the hole injecting electrode and the electron injecting electrode. A single-layer structure wherein a single layer has all functions, too, is reported in conjunction with a polymer or mixture system.

Typical structures of the organic EL device are shown in FIGS. 3 and 4.

In FIG. 3, a hole transporting layer 14 and a light emitting layer 15, each made of an organic compound, are formed between a hole injecting electrode 12 provided on a substrate 11 and an electron injecting electrode 13. In this case, the light emitting layer 15 also functions as an electron transporting layer.

In FIG. 4, a hole transporting layer 14, a light emitting layer 15 and an electron transporting layer 16, each made of an organic compound, are formed between a hole injecting electrode 12 provided on a substrate 11 and an electron injecting electrode 13.

A problem common to these organic EL devices is reliability. In principle, an organic EL device comprises a hole injecting electrode and an electron injecting electrode and requires an organic layer for efficient injection and transportation of holes and electrons from between these electrodes. However, these materials are sensitive to damages during device fabrication, and offer a problem in conjunction with an affinity for electrodes. For the electron injecting electrode for the injection of electrons, it is required to use a metal having a low work function. For this reason, there is no choice but to use MgAg, AlLi, etc. for materials. However, these materials are susceptible to oxidation and lack stability, and so are a grave factor responsible for a reduction in the service life of the organic EL device and a reliability problem. A further problem is that the deterioration of an organic thin film is much severer than that of an LED or LD.

Most organic materials are relatively expensive. Otherwise stated, there is a great merit in providing low-cost organic EL device products by substituting a partial constitution film with an inexpensive inorganic material.

Furthermore, the development of a device having higher light emission efficiency, lower driving voltage and lesser power consumption than ever before is strongly desired.

To provide a solution to such problems, methods of taking advantage of merits of both an organic material and an inorganic material have been envisaged. That is, an organic/inorganic semiconductor junction structure wherein an organic hole transporting layer is substituted by an inorganic p-type semiconductor has been contemplated. Such contemplation has been investigated in Japanese Patent No. 2636341, and JP-A's 2-139893, 2-207488 and 6-119973. However, it is still impossible to obtain an organic EL device superior to prior art organic ELs in terms of emission performance and basic device reliability.

SUMMARY OF THE INVENTION

An object of the invention is to achieve an organic EL device which has an ever-longer service life, weather resistance, high stability and high efficiency, and is inexpensive as well.

The above object is achieved by the inventions defined below.

(1) An organic EL device comprising a substrate, a pair of a hole injecting electrode and a cathode formed on said substrate, and an organic layer located between these electrodes and taking part in at least a light emission function, wherein:

between said organic layer and said cathode there is provided an inorganic insulating electron injecting and transporting layer comprising:
a first component comprising at least one oxide selected from the group consisting of lithium oxide, rubidium oxide, potassium oxide, sodium oxide and cesium oxide,
a second component comprising at least one oxide selected from the group consisting of strontium oxide, magnesium oxide and calcium oxide, and
a third component comprising silicon oxide and/or germanium oxide.

(2) The organic EL device according to (1), wherein said cathode is formed of one or two or more metal elements selected from the group consisting of Al, Ag, In, Ti, Cu, Au, Mo, W, Pt, Pd, and Ni.

(3) The organic EL device according to (1), wherein in said inorganic insulating electron injecting and transporting layer, the ratio of each constituent with respect to all components is:
5 to 95 mol % for said first component,
5 to 95 mol % for said second component, and
5 to 95 mol % for said third component.

(4) The organic EL device according to (1), wherein said inorganic insulating electron injecting and transporting layer has a thickness of 0.1 to 2 nm.

DETAILED EXPLANATION OF THE PREFERRED EMBODIMENTS

Figure 1:
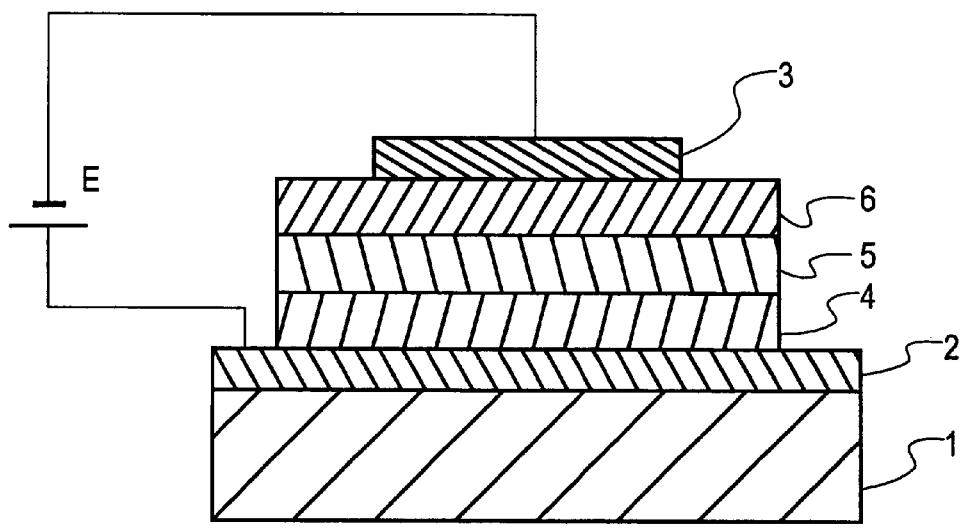
FIG. 1 is a sectional schematic of one embodiment of the organic EL device according to the invention.

The organic EL device of the invention comprises a substrate, a pair of a hole injecting electrode and a cathode formed on said substrate, and an organic layer located between these electrodes and taking part in at least a light emission function, wherein between said organic layer and said cathode there is provided an inorganic insulating electron injecting and transporting layer comprising a first component comprising at least one oxide selected from the group consisting of lithium oxide, rubidium oxide, potassium oxide, sodium oxide and cesium oxide, a second component comprising at least one oxide selected from the group consisting of strontium oxide, magnesium oxide and calcium oxide, and a third component comprising silicon oxide and/or germanium oxide.

By constructing the inorganic insulating electron injecting and transporting layer of the first, second, and third (stabilizer) components, it is possible to use a metal electrode having relatively high stability and satisfactory conductivity with no need of providing any special electrode having an electron injection function. This makes it possible to improve the electron injection and transportation efficiency of the inorganic insulating electron injecting and transporting layer and, hence, extend the service life of the device.

The inorganic insulating electron injecting and transporting layer comprises as the first component one or two or more oxides of lithium oxide ($Li_2O$), rubidium oxide ($Rb_2O$), potassium oxide ($K_2O$), sodium oxide ($Na_2O$), and cesium oxide ($Cs_2O$). These oxides may be used alone or in combination of two or more. When two or more such oxides are used, they may be mixed together at any desired ratio. of these oxides, lithium oxide ($Li_2O$) is most preferred. Next is rubidium oxide ($Rb_2O$), then potassium oxide ($K_2O$), and finally sodium oxide ($Na_2O$). When these oxides are used in a mixture form, it is preferable that lithium oxide and rubidium oxide account for at least 40 mol %, and especially at least 50 mol %, of the mixture.

The inorganic insulating electron injecting and transporting layer comprises as the second component one or two or more oxides of strontium oxide (SrO), magnesium oxide (MgO), and calcium oxide (CaO). These oxides may be used singly or in combination of two or more. When two or more such oxides are used, they may be mixed together at any desired ratio. Of these oxides, strontium oxide is most preferred. Next is magnesium oxide, and finally calcium oxide. When these oxides are used in a mixture form, it is preferable that strontium oxide accounts for at least 40 mol % of the mixture.

The inorganic insulating electron injecting and transporting layer comprises as the third component (stabilizer) silicon oxide ($SiO_2$) and/or germanium oxide ($GeO_2$). These oxides may be used singly or in a mixture form at any desired mixing ratio.

Each of the above oxides is usually present with its stoichiometric composition. However, the oxide may deviate somewhat from the stoichiometric composition.

In the inorganic insulting electron injecting and transporting layer according to the invention, the ratio of each constituent to all components is:

5 to 95 mol %, preferably 50 to 90 mol % for the first component, 5 to 95 mol %, preferably 50 to 90 mol % for the second component, and 0.5 to 20 mol %, preferably 5 to 10 mol % for the third component, as calculated on an SrO, MgO, CaO, $Li_2O$, $Rb_2O$, $K_2O$, $Na_2O$, $Cs_2O$, $SiO_2$, and $GeO_{hd\ 2}$ basis.

The inorganic insulating electron injecting and transporting layer should have a thickness of preferably 0.1 to 2 nm, and more preferably 0.3 to 0.8 nm.

The inorganic insulating electron injecting and transporting layer may be fabricated by various physical or chemical thin-film formation processes such as a sputtering process, and an EB evaporation process, with the sputtering process being preferred.

When the inorganic insulating electron injecting and transporting layer is formed by the sputtering process, it is preferable that the pressure of the sputtering gas during sputtering is in the range of 0.1 to 1 Pa. For the sputtering gas, inert gases used with an ordinary sputtering system, for instance, Ar, Ne, Xe, and Kr may be used. If required, $N_2$ may be used. Use may then be made of a sputtering atmosphere comprising a mixture of the sputtering gas with about 1 to 99% Of $O_2$. A single- or multi-stage sputtering process may be performed using the aforesaid oxide or oxides for a target or targets. It is here to be noted that the target is usually a mixed target comprising the above main component, a subordinate component and an additive. In this case, the obtained film composition has a oxygen content substantially equivalent to, or slightly lower than, that of the target.

For the sputtering process, an RF sputtering process using an RF power source, a DC sputtering process, etc. may be used, with the RF sputtering process being most preferred. Power for a sputtering system is preferably in the range of 0.1 to 10 $W/cm^2$ for RF sputtering, and the film formation rate is preferably in the range of 0.1 to 50 nm/min., and especially 1 to 10 nm/min.

When there is a fear that the organic layer, etc. may be ashed and so damaged during the lamination of the inorganic insulating electron injecting layer, it is preferable to divide the inorganic insulating electron injecting layer to two layers before lamination. That is, the first layer is laminated thin with no addition of oxygen thereto, and the second layer is then laminated thick with the addition of oxygen thereto. In this case, the first layer with no oxygen added thereto should have a thickness that is about ⅕ to ⅘ of the total thickness. At this time, the oxygen-deficient layer formed with no oxygen added thereto should preferably an oxygen content of the order of 60 to 90%. The oxidized layer formed with the addition of oxygen thereto is usually present with the stoichiometric composition for an ordinary oxide. However, the oxide layer may have a composition deviating somewhat from the stoichiometric composition. Accordingly, the difference in oxygen content between the oxygen-deficient layer and the oxidized layer should preferably be at least 10%, and especially at least 20%. Alternatively, the oxygen content may change continuously in the above range.

During film formation, the temperature of the substrate is about room temperature (25° C.) to 150° C.

A cathode is located on the inorganic insulating electron injecting and transporting layer (that faces away from the light emitting layer). For the cathode, an ordinary metal rather than a special metal may be used because it is not required to have electron injection capability with a low work function. Especially in view of conductivity and ease of handling, it is preferable to use one or two metal elements selected from the group of Al, Ag, In, Ti, Cu, Au, Mo, W, Pt, Pd, and Ni, and especially Al, and Ag.

When the organic EL device of the invention is fabricated in combination with the foregoing inorganic insulating electron injecting and transporting layer, it is preferable to use the above metal element or elements for the cathode. If required, however, it is acceptable to use the following metals. For instance, mention may be made of pure metal elements such as K, Li, Na, Mg, La, Ce, Ca, Sr, Ba, Sn, Zn, and Zr, and a binary or ternary alloy system containing these metals and serving as a stability improver, for instance, Ag·Mg (Ag: 0.1 to 50 at %), Al·Li (Li: 0.01 to 14 at %), In·Mg (Mg: 50 to 80 at %), and Al·Ca (Ca: 0.01 to 20 at %).

The cathode thin film should preferably have at least a certain thickness enough to impart electrons to the inorganic insulating electron injecting and transporting layer or a thickness of at least 50 nm, and preferably at least 100 nm. Although there is no particular upper limit to the cathode thickness, the cathode may usually have a thickness of the order of 50 to 500 nm.

The hole injecting electrode should preferably be primarily composed of a material that can inject holes in the hole injecting layer with high efficiency and has a work function of 4.5 eV to 5.5 eV, for instance, any one of tin-doped indium oxide (ITO), zinc-doped indium oxide (IZO), indium oxide ($In_2O_3$), tin oxide ($SnO_2$), and zinc oxide (ZnO). It is here to be noted that these oxides may deviate somewhat from their stoichiometric compositions. Regarding ITO, it is desired that the mixing ratio of $SnO_2$ with respect to $In_2O_3$ be in the range of 1 to 20 wt %, and especially 5 to 12 wt %. Regarding IZO, the mixing ratio of ZnO with respect to $In_2O_3$ is usually or the order of 12 to 32 wt %.

The hole injecting electrode may further contain silicon oxide ($SiO_2$) for work function control. The content of silicon oxide ($SiO_2$) should preferably be of the order of 0.5 to 10% in terms of the molar ratio of $SiO_2$ to ITO. The incorporation of $SiO_2$ contributes to an increase in the work function of ITO.

The electrode on the side out of which light is taken should preferably have a light transmittance of at least 50%, especially at least 60%, more especially at least 80%, and even more especially at least 90% with respect to light emitted at an emission wavelength of usually 400 to 700 nm. With decreasing transmittance, the light emitted from the light emitting layer attenuates, and so it is difficult to obtain the luminance needed for a light emitting device. In some cases, the light transmittance may be intentionally reduced as by increasing the contrast ratio for better viewability, etc.

The electrode should preferably have a thickness of 50 to 500 nm, and especially 50 to 300 nm. Although there is no particular upper limit to the electrode thickness, too thick an electrode gives rise to concerns such as a transmittance drop, and defoliation. Too thin an electrode fails to obtain sufficient effect, and offers a problem in conjunction with film thickness, etc. during device fabrication.

Figure 2:
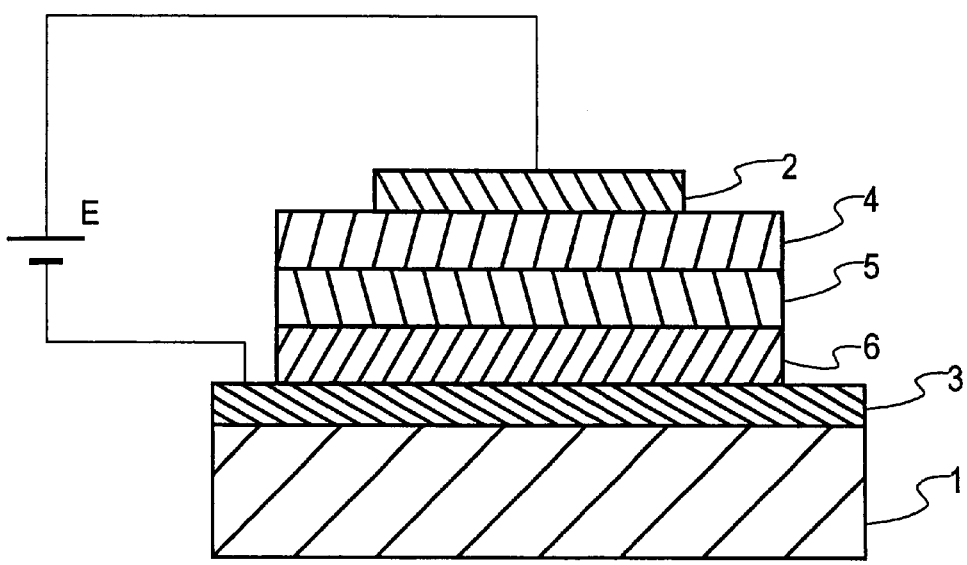
FIG. 2 is a sectional schematic of another embodiment of the organic EL device according to the invention.
Figure 3:
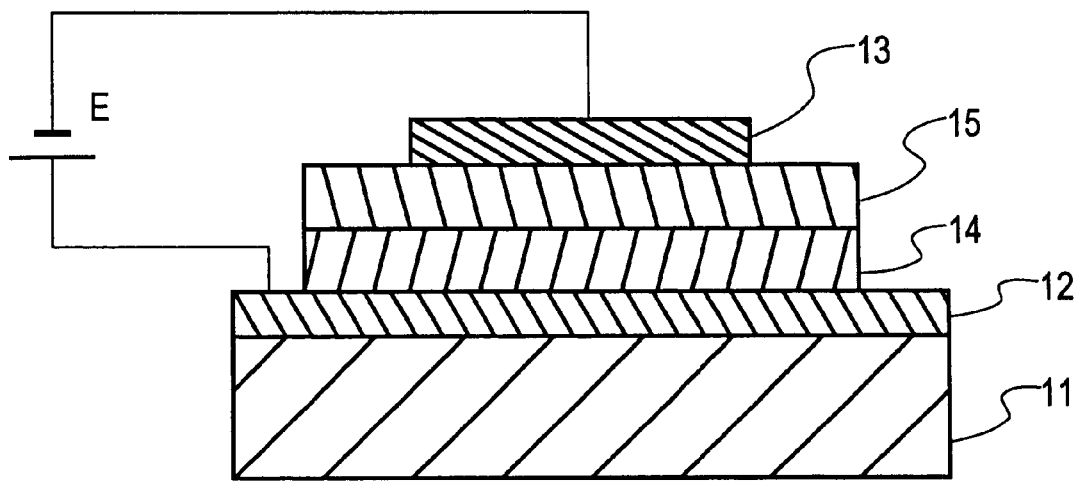
FIG. 3 is a sectional schematic of one exemplary arrangement of a prior art organic EL device.
Figure 4:
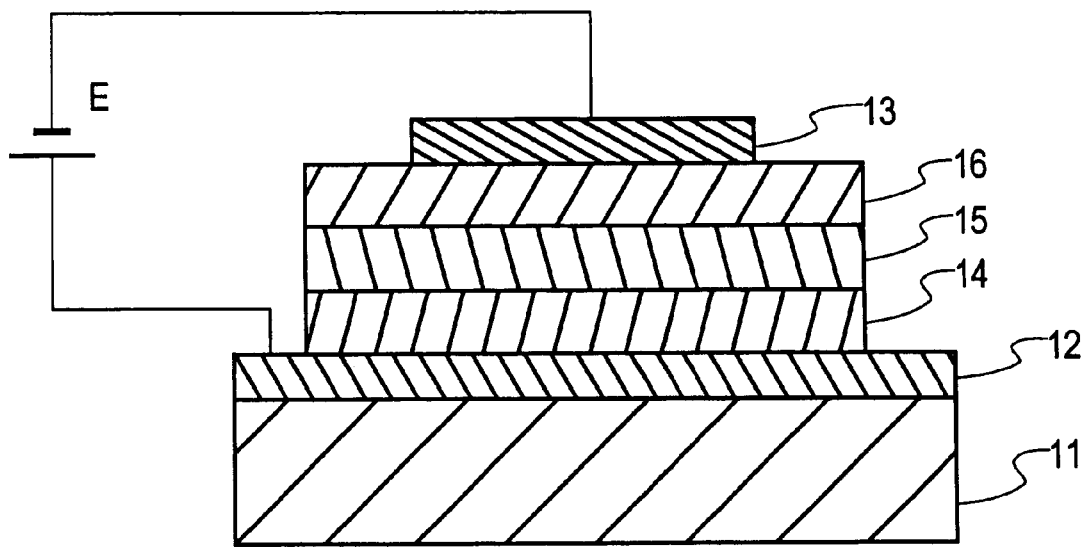
FIG. 4 is a sectional schematic of another exemplary arrangement of the prior art organic EL device.

As typically shown in FIG. 1, one embodiment of the organic EL device of the invention comprises, in order from a substrate 1, a hole injecting electrode 2, a hole injecting and transporting layer 4, a light emitting layer 5, an inorganic insulating electron injecting and transporting layer 6 and a cathode 3 which are laminated together on the substrate 1. Another embodiment of the organic EL device of the invention is reversed in multilayer arrangement to the first embodiment of the invention (the hole injecting electrode is opposite to the substrate side); it comprises, in order from a substrate 1, a cathode 3, an inorganic insulating electron injecting and transporting layer 6, a light emitting layer 5, a hole injecting and transporting layer 4 and a hole injecting electrode 2 which are laminated together on the substrate 1, as shown in FIG. 2. The reversed multilayer arrangement can prevent damage to the organic layer due to ashing during the formation of the inorganic insulating electron injecting layer. In this case, it is preferable to divide the inorganic insulating electron injecting and transporting layer to two layers as mentioned above. These embodiments may be properly chosen depending on display fabrication processes, etc. In FIGS. 1 and 2, a driving power source E is connected between the hole injecting electrode 2 and the cathode 3. The term "light emitting layer" is here understood to refer to a light emitting layer in a broad sense and so encompass a hole injecting and transporting layer, a light emitting layer in a narrow sense, a hole transporting layer, etc.

In the above device, a plurality of light emitting layers may be cascaded one upon another for color tone control of emitted light, and multicolor light emission.

The light emitting layer is made up by lamination of one or two or more organic compound thin films taking part in at least the light emission function.

The light emitting layer has functions of injecting holes and electrons, transporting them, and recombining holes and electrons to create excitons. For the light emitting layer, it is preferable to use a relatively electronically neutral compound, so that the electrons and holes can be easily injected and transported in a well-balanced state.

If required, the light emitting layer may comprise in addition to the light emitting layer in a narrow sense a hole injecting and transporting layer, an electron transporting layer, etc.

The hole injecting and transporting layer has functions of facilitating injection of holes from the hole injecting electrode, providing stable transportation of holes and blocking electrons. The electron injecting and transporting layer, provided as occasion demands, has functions of facilitating injection of electrons from the inorganic insulating electron injecting and transporting layer, providing stable transportation of electrons and blocking holes. These layers are effective for increasing the number of holes and electrons injected into the light emitting layer and confining holes and electrons therein for optimizing the recombination region to improve light emission efficiency. Usually, an organic electron transporting layer is not provided.

No particular limitation is imposed on the thickness of the light emitting layer, the thickness of the hole injecting and transporting layer, and the thickness of the electron transporting layer. However, these layers should preferably a thickness of the order of usually 5 to 500 nm, and especially 10 to 300 nm although varying depending on formation processes.

The thickness of the hole injecting and transporting layer, and the electron transporting layer are approximately equal to, or range from about $\frac{1}{10}$ times to about 10 times, the thickness of the light emitting layer although it depends on the design of the recombination/light emitting region. When the hole injecting and transporting layer is separated into an injecting layer and a transporting layer, it is preferable that the injecting layer is at least 1 nm thick and the transporting layer is at least 1 nm thick. The upper limit to thickness is usually about 500 nm for the injecting layer and about 500 nm for the transporting layer. The same film thickness is also true of the case where two injecting and transporting layers are provided.

In the organic EL device according to the invention, the light emitting layer contains a fluorescent material that is a compound capable of emitting light. The fluorescent material used herein, for instance, may be at least one compound selected from compounds such as those disclosed in JP-A 63-264692, e.g., quinacridone, rubrene, and styryl dyes. Use may also be made of quinoline derivatives such as metal complex dyes containing 8-quinolinol or its derivative as ligands, for instance, tris(8-quinolinolato)aluminum, tetraphenylbutadiene, anthracene, perylene, coronene, and 12-phthaloperinone derivatives. Use may further be made of phenylanthracene derivatives disclosed in JP-A 8-12600 (Japanese Patent Application No. 6-110569) and tetraarylethene derivatives disclosed in JP-A 8-12969 (Japanese Patent Application No. 6-114456).

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission of the host substance, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato) gallium, bis(5-chloro-8-quinolinolato)calcium, 5,7-dichloro-8-quinolinolato-aluminum, tris(5,7-dibromo-8-hydroxyquinolinolato)aluminum, and poly[zinc(II)-bis(8-hydroxy-5-quinolinyl)methane].

Use may also be made of aluminum complexes containing other ligands in addition to 8-quinolinol or its derivatives, for instance, bis(2-methyl-8-quinolinolato)(phenolato) aluminum (III), bis(2-methyl-8quinolinolato)(o-cresolato) aluminum (III), bis(2-methyl8-quinolinolato)(m-cresolato) aluminum (III), bis(2-methyl-8-quinolinolato)(p-cresolato) aluminum (III), bis(2-methyl-8-quinolinolato)(o-phenyl-phenolato)aluminum (III), bis(2-methyl-8-quinolinolato)(mphenylphenolato)aluminum (III), bis(2-methyl-8-quinolinolato) (p-phenylphenolato)aluminum (III), bis(2-methyl-8-quinolinolato) (2,3-dimethylphenolato)aluminum (III), bis(2-methyl-8-quinolinolato)(2,6-dimethylphenolato) aluminum (III), bis(2-methyl-8-quinolinolato)(3,4-dimethylphenolato)aluminum (III), bis(2-methyl-8-quinolinolato)(3,5-dimethylphenolato) aluminum (III), bis (2-methyl-8-quinolinolato) (3,5-di-tertbutylphenolato) aluminum (III), bis(2-methyl-8-quinolinolato) (2,6-diphenylphenolato)aluminum (III), bis(2-methyl-8-quinolinolato)(2,4,6-triphenylphenolato)aluminum (III), bis (2-methyl-8-quinolinolato)(2,3,6-trimethylphenolato) aluminum (III), bis(2-methyl-8-quinolinolato) (2,3,5,6-tetramethylphenolato)aluminum (III), bis(2-methyl-8-quinolinolato)(1-naphtholato)aluminum (III), bis(2-methyl8-quinolinolato)(2-naphtholato)aluminum (III), bis (2,4-dimethyl-8-quinolinolato)(o-phenylphenolato) aluminum (III), bis(2,4-dimethyl-8-quinolinolato) (pphenylphenolato)aluminum (III), bis(2,4-dimethyl-8-quinolinolato)(m-phenylphenolato) aluminum (III), bis(2,4-dimethyl-8-quinolinolato) (3,5-dimethylphenolato) aluminum (III), bis(2,4-dimethyl-8-quinolinolato) (3,5-ditertbutylphenolato)aluminum (III), bis(2-methyl-4-ethyl-8-quinolinolato)(p-cresolato)aluminum (III), bis(2-methyl-4-methoxy-8-quinolinolato)(p-phenyl-phenolato)aluminum (III), bis(2-methyl-5-cyano-8-quinolinolato)(ocresolato) aluminum (III), and bis(2-methyl-6-trifluoromethyl-8-quinolinolato) (2-naphtholato)aluminum (III).

Besides, use may be made of bis(2-methyl-8-quinolinolato)aluminum (III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum (III)-$\mu$-oxo-bis(4-ethyl-2-methyl-8-quinolinolato)aluminum (III), bis(2-methyl-4-methoxyquinolinolato)aluminum (III)-$\mu$-oxo-bis (2-methyl-4-methoxyquinolinolato)aluminum (III), bis(5-cyano-2-methyl8-quinolinolato)aluminum (III)-$\mu$-oxo-bis(5-cyano-2-methyl8-quinolinolato)aluminum (III), bis(2-methyl-5-trifluoromethyl-8-quinolinolato)aluminum (III)-$\mu$-oxo-bis(2-methyl-5-trifluoromethyl-8-quinolinolato) aluminum (III), etc.

Other preferable host substances include phenylanthracene derivatives disclosed in JP-A 8-12600 (Japanese Patent Application No. 6-110569), tetraarylethene derivatives disclosed in JP-A 8-12969 (Japanese Patent Application No. 6-114456), etc.

In the practice of the invention, the light emitting layer may also serve as an electron transporting layer. In this case, it is preferable to use a fluorescent material, e.g., tris(8-quinolinolato)aluminum or the like, which may be provided by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato) aluminum (Alq$^3$). It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

In this case, the ratio of mixing the compound capable of injecting and transporting holes with respect to the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 80/20.

The thickness of the mixed layer should preferably be equal to or larger than the thickness of a single molecular layer, and less than the thickness of the organic compound layer. More specifically, the mixed layer has a thickness of preferably 10 to 150 nm, and more preferably 50 to 100 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the compounds for the injection and transportation of holes, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyldiamine (TPD)), aromatic tertiary amines, hydrazone derivatives, carbazole derivatives, triazole derivatives, imidazole derivatives, oxadiazole derivatives having an amino group, and polythiophenes. The compounds may be used singly or in combination of two or more. Where two or more such compounds are used, they may be stacked as separate layers, or otherwise mixed.

For the electron transporting layer which is provided if necessary, there may be used quinoline derivatives such as organic metal complexes containing 8-quinolinol or its derivatives as ligands, for instance, tris(8-quinolinolato) aluminum ($Alq^3$), oxadiazole derivatives, perylene derivatives, pyridine derivatives, pyrimidine derivatives, quinoxaline derivative, diphenylquinone derivatives, and nitro-substituted fluorene derivatives. The electron transporting layer may also serve as a light emitting layer. In this case, it is preferable to use tris(8-quinolilato)aluminum, etc. The electron transporting layer may be formed as by deposition by evaporation, as is the case with the light emitting layer. The electron transporting layer formed of the organic material may be provided depending on device structure, and other conditions, although this layer is usually unnecessary.

Preferably, the hole injecting and transporting layer, the light emitting layer, and the electron transporting layer composed of an organic material are formed by a vacuum evaporation process because a uniform thin film can then be obtained. With the vacuum evaporation process, it is thus possible to obtain a uniform thin film in an amorphous state or with a grain size of up to 0.2 $\mu$m. A grain size of greater than 0.2 $\mu$m results in non-uniform light emission. To avoid this, it is required to make the driving voltage of the device high. However, this in turn gives rise to some considerable drop of hole injection efficiency.

No particular limitation is imposed on conditions for vacuum evaporation. However, the vacuum evaporation should preferably be carried out at a degree of vacuum of up to $10^{-4}$ Pa and a deposition rate of about 0.01 to 1 nm/sec. Also, the layers should preferably be continuously formed in vacuum, partly because the deposition of impurities on the interface between adjacent layers is avoidable resulting in the achievement of high performance, and partly because the driving voltage of the device can be lowered with elimination of dark spots or no growth of dark spots.

When the layers, each containing a plurality of compounds, are formed by the vacuum evaporation process, it is preferable that co-evaporation is carried out while each boat with the compounds charged therein is placed under temperature control.

Preferably, the device is sealed up by means of a sealing sheet, etc. for the purpose of preventing oxidation of the organic layers and electrodes in the device. To prevent penetration of moisture, the sealing sheet is bonded to the device using an adhesive resin layer to seal up the device. An inert gas such as Ar, He, and $N_2$ is preferably used as a sealing gas. Then, the sealing gas should preferably have a moisture content of up to 100 ppm, especially up to 10 ppm, and more especially up to 1 ppm. Although there is no particular lower limit to the moisture content, the sealing gas should usually have a moisture content of about 0.1 ppm.

The sealing sheet, preferably in a flat sheet form, may be made of transparent or translucent materials such as glasses, quartz, and resins, among which the glasses are preferred. For such a glass material, alkali glass is preferable from a cost standpoint. Other preferable glass materials, for instance, include soda lime glass, lead alkali glass, borosilicate glass, aluminosilicate glass, and silica glass. In particular, a soda glass material subjected to no surface treatment is inexpensive and so is preferable. A metal sheet, a plastic sheet, etc., too, may be used in place of the sealing glass sheet.

For height control, a spacer is used to keep the sealing sheet at a height as desired. The spacer material may be resin beads, silica beads, glass beads, glass fibers, etc., with the glass beads being most preferred. The spacer is usually in a particulate form having a uniform particle size. In the invention, however, a spacer of any desired shape may be used provided that it can function well. The spacer size should preferably be 1 to 20 $\mu$m, especially 1 to 10 $\mu$m, and more especially 2 to 8 $\mu$m as calculated on a circle diameter basis. A spacer having such a diameter should preferably have a particle length of up to about 100 $\mu$m. Although there is no particular lower limit to the particle size, the particle size should usually be equal to or larger than the diameter.

The spacer may or may not be used when a recess is provided in the sealing sheet. When the spacer is used, its size is preferably within the aforesaid range, and more preferably within the range of 2 to 8 $\mu$m.

The spacer may have been incorporated in the sealing adhesive agent or may be incorporated in the sealing adhesive agent at the time of bonding. The content of the spacer in the sealing adhesive agent should be preferably 0.01 to 30 wt %, and more preferably 0.1 to 5 wt %.

For the adhesive agent, it is preferable to use a cation curing epoxy resin of the ultraviolet curing type, although an adhesive agent of the type that ensures stable adhesion strength and good airtightness may be used.

For the substrate on which an organic EL structure is formed according to the invention, a noncrystalline substrate such as a glass or quartz substrate, and a crystalline substrate such as an Si, GaAs, ZnSe, ZnS, GaP or InP substrate may be used. The crystalline substrate may also be provided with a crystalline or noncrystalline buffer layer or a metal buffer layer. For a metal substrate, Mo, Al, Pt, Ir, Au, Pd, and other metal substrates may be used. However, it is preferable to use a glass substrate. The substrate is usually located on the side out of which light is taken, and so it should preferably be transparent to light as in the above electrodes.

In the invention, a number of devices may be arranged on a plane. A color display may be constructed by changing the colors of light emitted from the devices arranged on the plane.

The substrate may be provided with a color filter film, fluorescent material-containing color conversion film or dielectric reflecting film for controlling the color of light emission.

For the color filter film, a color filter employed with liquid crystal display devices, etc. may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO or IZO film formation.

The light absorbing material is used when light is not fully absorbed by the fluorescent material, and so may be dispensed with, if not required. For the light absorbing material, it is preferable to make a selection from materials that do not extinguish fluorescence.

The organic EL device of the invention is generally of the DC drive type while it may be of the AC or pulse drive type. The applied voltage is generally of the order of 2 to 30 volts.

EXAMPLE

The present invention is explained more specifically with reference to some examples.

Example 1

A 7059 substrate (made by Corning) used as a glass substrate was scrubbed with neutral detergent. Then, the substrate was fixed to a substrate holder in a sputtering system, where an ITO hole injecting electrode layer was formed by a DC magnetron sputtering process using an ITO oxide target.

The substrate with the ITO film formed on it was ultrasonically washed with neutral detergent, acetone, and ethanol, and then pulled up from boiling ethanol, followed by drying. The substrate was subsequently cleaned on its surface with $UV/O_3$. Then, the substrate was fixed to the substrate holder in a vacuum evaporation system, which was evacuated to a vacuum of $1 \times 10^{-4}$ Pa or lower.

Then, polythiophene was deposited by evaporation at a deposition rate of 0.1 nm/sec. to a thickness of 10 nm thereby forming a hole injecting layer, and TPD was deposited by evaporation at a deposition rate of 0.1 nm/sec. to a thickness of 20 nm thereby forming a hole transporting layer.

With the vacuum kept, tris(8-quinolinolato)aluminum ($Alq^3$) and rubrene were deposited by evaporation at an overall deposition rate of 0.2 nm/sec. to a thickness of 40 nm thereby forming a light emitting layer. $Alq^3$ was doped with 5 vol % of rubrene.

With the vacuum still maintained, this EL structure was transferred to a sputtering system where a 0.8-nm thick inorganic insulating electron injecting and transporting layer was formed using a target obtained by mixing together the target materials strontium oxide (SrO), lithium oxide ($Li_2O$) and silicon oxide ($SiO_2$) in such a manner that SrO was 80 mol % with respect to all components, $Li_2O$ was 10 mol % with respect to all components and $SiO_2$ was 10 mol % with all components. Referring to film formation conditions at this time, the substrate temperature was 25° C., the sputtering gas was Ar, the film formation rate was 1 nm/min., the operating pressure was 0.5 Pa, and the input power was 5 $W/cm^2$. In this case, the inorganic insulating electron injecting and transporting layer was first formed to a thickness of 0.4 nm while 100% Ar was fed at 100 SCCM, and the inorganic insulating electron injecting and transporting layer was then formed to a thickness of 0.4 nm while Ar and $O_2$ at 1:1 were fed at 100 SCCM.

With the vacuum still kept, Al was deposited by evporation to a thickness of 200 nm, thereby forming a cathode.

Finally, the EL structure was sealed up by glass to obtain an organic EL device (forward lamination). A comparative sample was obtained as in Example 1 with the exception that instead of the inorganic insulating electron injecting and transporting layer, an electron injecting and transporting layer was formed by deposition by evaporation of tris(8-quinolinolato)aluminum ($Alq^3$) at a deposition rate of 0.2 nm/sec. to a thickness of 30 nm, and an electron injecting electrode was formed by deposition by evaporation of MgAg (at a weight ratio of 10:1) at a deposition rate of 0.2 nm/sec. to a thickness of 200 nm, while the vacuum was still kept.

When an electric field was applied to the obtained organic EL device in the air, it showed diode performance. When the device was biased with ITO on a positive side and Al on a negative side, the current increased with increasing voltage, and distinct light emission was observed from the sealing sheet side in an ordinary room. Even upon repetitive emission operations, no luminance decrease was found.

Each sample was subjected to accelerated testing while a constant current of 100 $mA/cm^2$ was applied thereto, thereby examining its emission luminance and life performance. The inventive sample showed an about 10% emission luminance improvement over the comparative sample constructed in quite the same manner as mentioned above with the exception that an electron injecting and transporting layer was formed of an organic material as in the prior art. The luminance half-life of the comparative sample was 100 hours or shorter whereas that of the inventive sample was 200 hours or longer.

Example 2

Experiments were carried out as in Example 1 with the exception that the main component, subordinate component and stabilizer in the inorganic insulating electron injecting and transporting layer were changed from SrO to MgO, CaO or an oxide mixture thereof, from $Li_2O$ to $K_2O$, $Rb_2O$, $K_2O$, $Na_2O$, $Cs_2O$ or an oxide mixture thereof, and from $SiO_2$ to $GeO_2$ or an $SiO_2$ and $GeO_2$ oxide mixture. The obtained results were much the same as Example 1. The same was also true of when the cathode constituting material was changed from Al to Ag, In, Ti, Cu, Au, Mo, W, Pt, Pd, Ni or an alloy thereof.

EFFECT OF THE INVENTION

According to the invention as explained above, it is possible to achieve an organic EL device which has an extended life, weather resistance, high stability, and high efficiency, and is inexpensive as well.

What we claim is:

1. An organic EL device comprising a substrate, a hole injecting electrode, a cathode, and an organic layer located between said hole injecting electrode and said cathode and taking part in at least a light emission function, wherein:
    between said organic layer and said cathode there is provided an inorganic insulating electron injecting and transporting layer comprising:
        a first component comprising at least one oxide selected from the group consisting of lithium oxide, rubidium oxide, potassium oxide, sodium oxide and cesium oxide,
        a second component comprising at least one oxide selected from the group consisting of strontium oxide, magnesium oxide and calcium oxide, and
        a third component comprising at least one of silicon oxide and germanium oxide
    and wherein either said hole injecting electrode, or said cathode, is formed on said substrate.

2. The organic EL device according to claim 1, wherein said cathode is formed of one or two or more metal elements selected from the group consisting of Al, Ag, In, Ti, Cu, Au, Mo, W, Pt, Pd, and Ni.

3. The organic EL device according to claim 1, wherein in said inorganic insulating electron injecting and transporting layer, the ratio of each constituent with respect to all components is:
    5 to 95 mol % for said first component,
    5 to 95 mol % for said second component, and
    5 to 95 mol % for said third component.

4. The organic EL device according to claim 1, wherein said inorganic insulating electron injecting and transporting layer has a thickness of 0.1 to 2 nm.

* * * * *